(12) United States Patent
Gritters

(10) Patent No.: US 7,528,618 B2
(45) Date of Patent: May 5, 2009

(54) EXTENDED PROBE TIPS

(75) Inventor: John K. Gritters, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 237 days.

(21) Appl. No.: 11/381,274

(22) Filed: May 2, 2006

(65) Prior Publication Data

US 2007/0259456 A1 Nov. 8, 2007

(51) Int. Cl.
*G01R 31/02* (2006.01)
(52) U.S. Cl. .................. 324/754; 324/762
(58) Field of Classification Search .......... None
See application file for complete search history.

(56) References Cited

U.S. PATENT DOCUMENTS

| | | | |
|---|---|---|---|
| 4,784,972 A | 11/1988 | Hatada | |
| 4,916,002 A | 4/1990 | Carver | |
| 5,513,430 A | 5/1996 | Yanof | |
| 5,546,375 A | 8/1996 | Shimada | |
| 5,583,368 A | 12/1996 | Kenney | |
| 5,828,226 A | 10/1998 | Higgins et al. | |
| 5,914,614 A | 6/1999 | Beaman et al. | |
| 5,969,422 A | 10/1999 | Ting et al. | |
| 6,344,752 B1 | 2/2002 | Hagihara et al. | |
| 6,359,337 B1 | 3/2002 | Keukelaar et al. | |
| 6,441,315 B1 * | 8/2002 | Eldridge et al. | 174/260 |
| 6,672,876 B1 | 1/2004 | Takekoshi | |
| 6,747,465 B2 | 6/2004 | Esashi et al. | |
| 6,791,176 B2 | 9/2004 | Mathieu et al. | |
| 6,920,689 B2 | 7/2005 | Khandros et al. | |
| 6,933,738 B2 | 8/2005 | Martin et al. | |
| 7,005,233 B2 | 2/2006 | Fang | |
| 7,010,854 B2 | 3/2006 | Eldridge et al. | |
| 7,063,541 B2 | 6/2006 | Grube et al. | |
| 7,073,254 B2 | 7/2006 | Eldridge et al. | |
| 7,086,149 B2 | 8/2006 | Eldridge et al. | |
| 7,122,760 B2 | 10/2006 | Mathieu et al. | |
| 7,225,538 B2 | 6/2007 | Eldridge et al. | |
| 7,342,402 B2 | 3/2008 | Kim et al. | |
| 2001/0026980 A1 | 10/2001 | Mizuo | |
| 2003/0189439 A1 * | 10/2003 | Kohno et al. | 324/754 |

(Continued)

FOREIGN PATENT DOCUMENTS

EP 802419 10/1997

(Continued)

OTHER PUBLICATIONS

Preliminary Report On Patentability for PCT aaplication US2007/010739 (Nov. 13, 2008), 8 pages.

*Primary Examiner*—Evan Pert
*Assistant Examiner*—Scott R Wilson
(74) *Attorney, Agent, or Firm*—N. Kenneth Burraston

(57) ABSTRACT

Probe tips, methods for making probe tips, and method for using such probe trips are described. The probe tips can include a pedestal portion connected to a beam of a cantilever structure and a contact portion that can contact an electronic component that to be tested. The pedestal portion and contact portions can have a generally trapezoidal shape. The probe tips can also include a rectangular-shaped extension portion located between the base and contact portions. The probe tips can be made using a dual-etching process that creates the generally trapezoidal shape of the base and contact portions and the generally rectangular-shaped extension portion.

15 Claims, 11 Drawing Sheets

U.S. PATENT DOCUMENTS

| | | |
|---|---|---|
| 2003/0199179 A1 | 10/2003 | Dozier, II et al. |
| 2005/0212010 A1 | 9/2005 | Shigeno |
| 2006/0038576 A1 | 2/2006 | Tadayon |
| 2006/0278825 A1* | 12/2006 | van der Weide et al. ..... 250/306 |
| 2007/0293053 A1 | 12/2007 | Kim et al. |

FOREIGN PATENT DOCUMENTS

| | | | |
|---|---|---|---|
| JP | 59-88860 | | 5/1984 |
| JP | 06-084455 | | 3/1994 |
| JP | 06102006 A | * | 4/1994 |
| WO | WO 98/52224 | | 11/1998 |

* cited by examiner

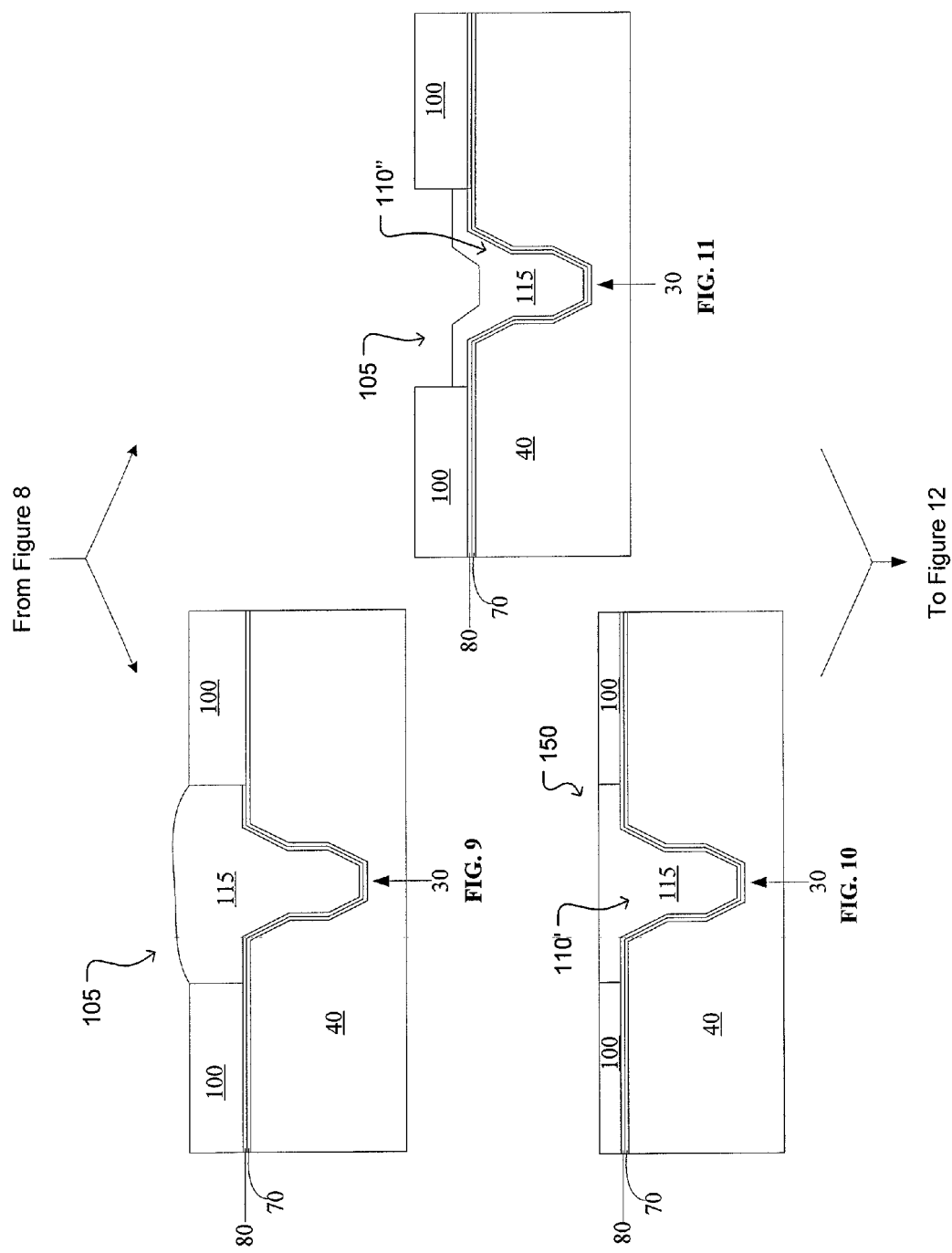

EXTENDED PROBE TIPS

BACKGROUND

When electronic components, including semiconductor devices, are manufactured they are often tested to determine whether they operate properly. The equipment used for this testing process can include a probe system having a plurality of probes for making temporary electrical connections with the semiconductor device. Test data can then be provided through the probes to the semiconductor device, and response data generated by the semiconductor device can be provided through the probes to equipment (e.g., a test controller) configured to evaluate operation of the semiconductor device. FIG. 1A illustrates one such probe attached to a probe system 300 (which would typically include many such probes). The probe shown in FIG. 1A comprises a cantilever structure 310 containing a base 315 with a tip 320 thereon. In use, the probe system 300 is oriented over the semiconductor device 330, which can have a passivation layer 350, and then lowered so that the tip 320 contacts a terminal 340 during the testing procedure.

FIG. 1B illustrates a potential problem commonly referred to as heel strike, which generally should be avoided. To ensure that all tips 320 of all the probes (only one is shown in FIG. 1B but a probe system typically has many such probes) of probe system 300 make relatively low resistance electrical connections with terminals 340 (again only one is shown but semiconductor device 330 typically has many terminals 340), semiconductor device 330 is typically moved toward probe system 300 a particular distance past first contact between terminals 340 and tips 320. That distance is often referred to as over travel. Over travel can cause the cantilever structure 310 to bend and the base 315 to rotate and contact the passivation layer 350 (often referred to as heel strike), deteriorating the passivation layer 350 and causing problems with the testing process and potentially damaging the semiconductor device 330 and the probe system 300.

SUMMARY

Probe tips, methods for making probe tips, and methods for using such probe trips are described. In some embodiments of the invention, the probe tips can contain a pedestal portion connected to a cantilever structure and a contact portion that can be configured to contact an electronic component to be tested. The pedestal portion and contact portions can have a generally trapezoidal shape. The probe tips can also contain a generally rectangular-shaped extension portion located between the pedestal and contact portions. Because of the extension portion, the probe tips can be longer than conventional tips. The probe tips can be made using a dual-etching process that creates the generally trapezoidal shape of the pedestal and contact portions and the generally rectangular shape of the extension portion.

BRIEF DESCRIPTION OF THE DRAWINGS

FIGS. 2-14 illustrate various methods of making probe tips according to some embodiments of the invention;

Figure 1A:
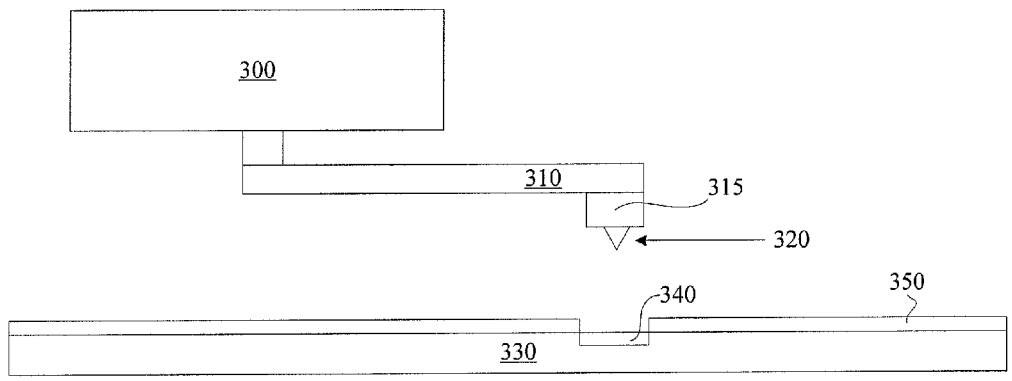
FIGS. 1A and 1B illustrate conventional probe systems.

The Figures presented in conjunction with this description are views of only particular—rather than complete—portions of the devices and methods of making the devices. Together with the following description, the Figures demonstrate and explain the principles of such devices and methods according to some embodiments of the invention. In the Figures, the thickness of layers and regions may be exaggerated in some instances for clarity. It will also be understood that when a layer is referred to as being "on" another layer or substrate, it can be directly on the other layer or substrate, or intervening layers may also be present. The same reference numerals in different drawings represent the same element, and thus their descriptions will be omitted.

DETAILED DESCRIPTION

Exemplary embodiments of the invention now will be described more fully with reference to the accompanying drawings. This invention may, however, be embodied in many different forms and should not be construed as being limited to the embodiments and aspects set forth herein. Although the exemplary embodiments are described with respect to probe tips for testing semiconductor dies, the invention is not so limited but can be used in any probing application.

Figure 2:
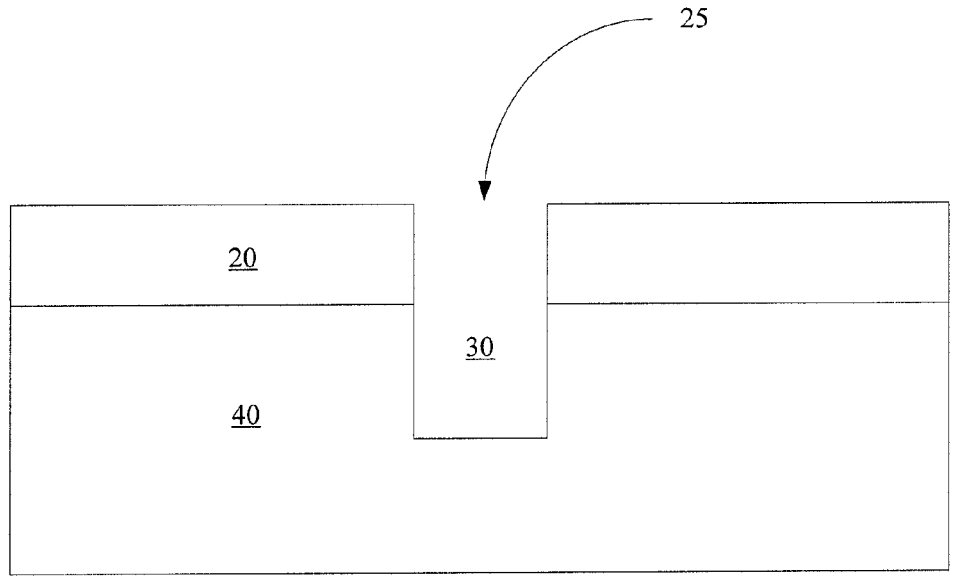

Methods of forming the probe tips, in some embodiments of the invention, can begin by providing a substrate, such as the substrate 40 shown in FIG. 2. Any substrate known in the art can be used, including silicon wafers, epitaxial silicon layers, polysilicon layers, bonded wafers such as used in silicon-on-insulator (SOI) technologies, and/or amorphous silicon layers, all of which may be doped or undoped. In some embodiments, the substrate can comprise a silicon wafer.

Pits 30 (one is shown but more can be provided) in substrate 40 can then be provided by any known method, including by using a masking and etching process. This process can be accomplished by providing a first mask layer 20 on the substrate 40. The first mask layer 20 can comprise either a single layer or multiple layers as known in the art. In some embodiments, the first mask layer 20 can comprise, for example, any suitable photoresist material.

The first mask layer 20 can contain a pattern of openings 25 (one is shown but more can be provided) that expose the upper surface of substrate 40. The openings 25 can generally correspond to the locations where the pits 30 will be formed. To form the openings 25, the first mask layer 20 can be patterned using any photolithographic process known in the art. The patterning process can remove portions of the photoresist material in the location of the desired openings. In some embodiments, the width of the openings, which can be substantially the same as the width of the pits 30, can range from about 25 to about 75 microns. In some embodiments, the width of the openings can be about 32 microns. The foregoing numerical examples are exemplary only and, in some embodiments, different numerical dimensions can be implemented.

With openings 25 formed in the first mask layer 20, pits 30 can then be formed in substrate 40 using any suitable process known in the art to obtain the structure shown in FIG. 2. In some embodiments of the invention, the pits 30 can be formed using any known etching process. In some embodiments, the etching process can be performed using a reactive ion etching (RIE) process (e.g., using a Bosch trench etch recipe). The etching process can be performed until the desired depth of the pits 30 is reached. In some embodiments, the depth of the pits 30 can range from about 10 to about 50 microns. In some embodiments, the depth of the pits can be about 30 microns. The foregoing numerical examples are exemplary only and, in some embodiments, different numerical dimensions can be implemented.

After forming the pits 30, the mask layer 20 can be removed by any suitable process known in the art. The photoresist material of the mask layer 20 can be removed using a conventional stripping solution such as a sulfuric acid and peroxide mixture (also known as a piranha mixture). Following removal of the mask layer 20, the resulting structure can be processed with an oxygen plasma to remove any polymer and/or passivation present in the pits 30. Further cleaning, if necessary, can be performed as known in the art.

Figure 3:
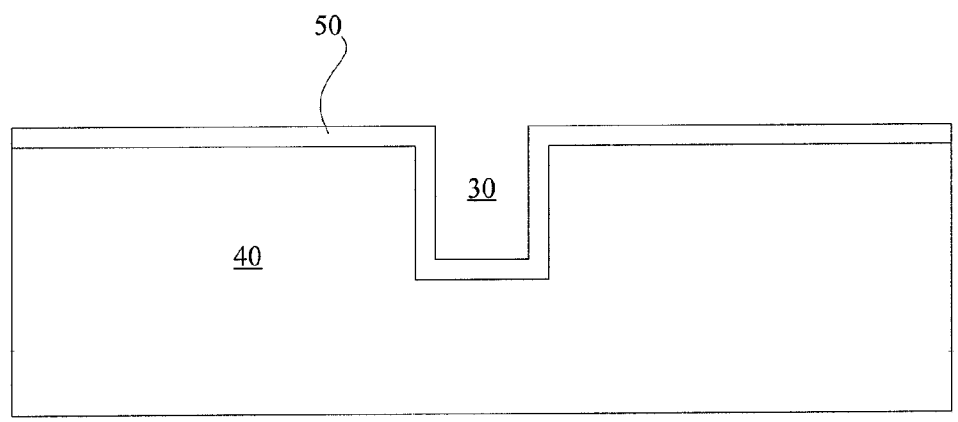

Next, as illustrated in FIG. 3, an etch stop layer 50 can be provided on the substrate 40 and the sidewalls and bottom of the pits 30. The etch stop layer 50 can comprise any material that will stop or block the next etching process (described below). In some embodiments, the etch stop layer 50 can comprise silicon oxide (or oxide). Such an oxide layer can be formed by any known deposition process or by any known oxidation process that oxidizes the silicon substrate.

Figure 4:
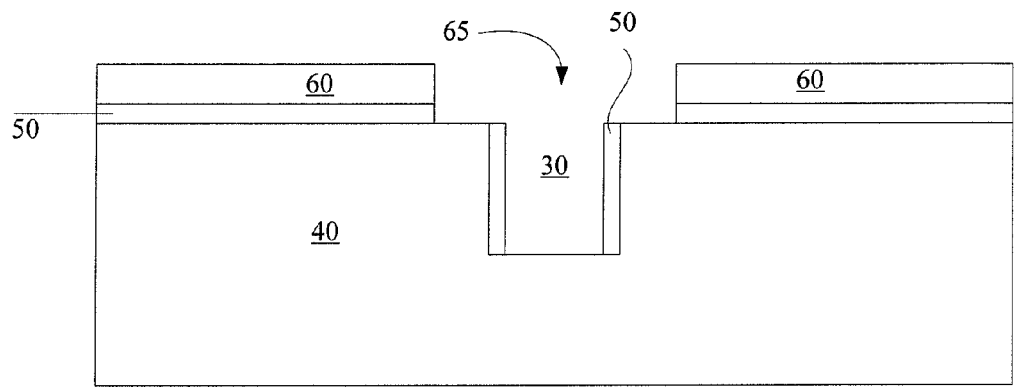

Then, as illustrated in FIG. 4, a second mask layer 60 can be provided. The second mask layer 60 can comprise either a single layer or multiple layers. In some embodiments, the second mask layer 60 can comprise, for example, any suitable photoresist material. The second mask layer 60 can contain a pattern of openings 65 (one is shown but many can be provided) that expose the pits 30 and the etch stop layer 50. To form the openings 65, the second mask layer 60 can be patterned during a photolithographic process as known in the art. The patterning process can remove portions of the photoresist material in the location of the desires openings. In some embodiments, the width of the openings 65 can range from about 3 to about 10 microns per side larger than the pits 30. In some embodiments, the width of the openings 65 can be about 40 microns. In some embodiments, the openings expose about 4 microns on either side of the pits 30. The foregoing numerical examples are exemplary only and, in some embodiments, different numerical dimensions can be implemented.

With openings 65 formed in the second mask layer 60, the horizontal portions of the etch stop layer 50 can be removed to obtain the structure shown in FIG. 4. The horizontal portions can be removed using any etching process. For example, a dry etching process can be used. In some embodiments, an etching process can be performed using an RIE oxide etch process using a carbon and fluorine gas mixture as the etchant, including a $CH_4$ and $CHF_3$ mixture. The etching process can be performed until these horizontal portions are removed.

Next, the mask layer 60 can be removed by any suitable process known in the art. The photoresist material can be removed using a conventional stripping solution such as a piranha mixture. Following removal of the mask layer 60, the resulting structure can be processed with an oxygen plasma to remove any polymer and/or passivation present in the pits 30. Further cleaning, if necessary, can be performed as known in the art. The resulting structure can contain the remaining portions 55 (see FIG. 5) of the etch block layer on the sidewalls of the pits and over most of the substrate 40.

Figure 5:
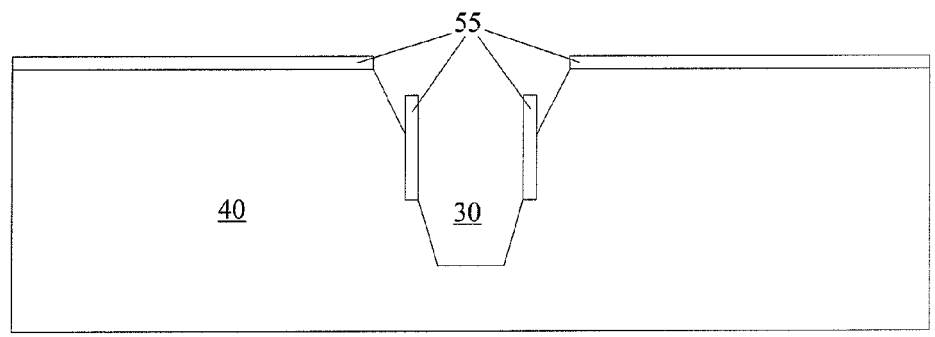

A third etching process can then be performed using the remaining portions 55 of etch stop 50 as a mask, as shown in FIG. 5. In this third etching process, portions of the substrate 40 not covered with the remaining potions 55 of the etch stop layer 50 can be etched. In this process, the depth of the pit 30 can be increased and the sidewalls of the pit 30 can be etched to form a substantially non-vertical (i.e., diagonal) shape. To obtain such a shape, the etching process can be performed using an anisotropic etching process. In some embodiments, the anisotropic etching process can be performed using potassium hydroxide (KOH) as the etchant (e.g., a crystallographic silicon etch).

The third etching process can be performed until enough of the substrate 40 is removed so that the desired shape is formed and the desired depth of the pit 30 is reached. Typically, the amount of substrate removed during this third etching process can add an additional depth (i.e., in the generally vertical direction in FIG. 5) to the pit 30 in a range from about 15 to about 45 microns. In some embodiments, the additional depth of the pit 30 added can be about 15 microns. The foregoing numerical examples are exemplary only and, in some embodiments, different numerical dimensions can be implemented.

Figure 6:
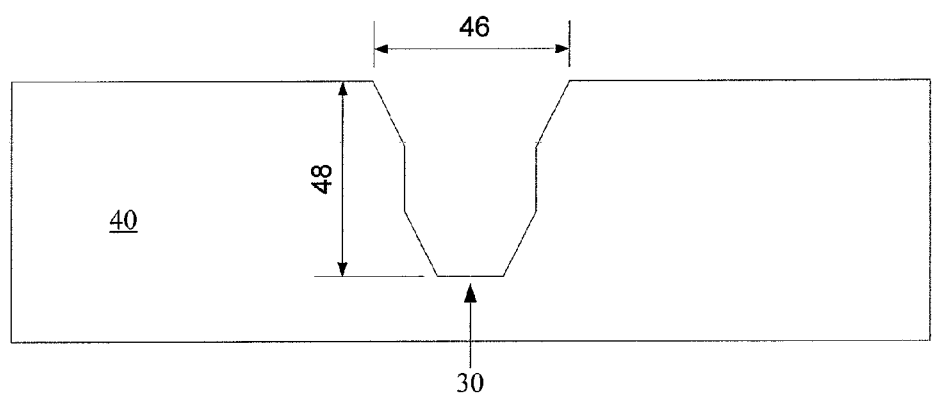

The remaining portions 55 of the etch block layer can then be removed to obtain the resulting structure depicted in FIG. 6. The remaining portions 55 can be removed using any known etching process that is selective to the material of the etch block layer, i.e., silicon oxide. In some embodiments, the etching process can be performed using a 10:1 BOE (buffered oxide etch) as the etchant.

Using the exemplary process illustrated in FIGS. 2-6, pit 30 can be formed with an aspect ratio of greater than 0.7, which has been the highest aspect ratio, known to the inventor, achievable using prior art methods. (For example, known crystallographic silicon etching technology is not capable of etching at an aspect ratio greater than 0.7.) That is, the ratio of the depth 48 of the pit 30 to the width 46 of the opening of the pit 30 (which is the aspect ratio of the pit 30) can be made to be greater than 0.7. For example, the aspect ratio can be made to be greater than 1 or even greater than 2. Thus, the depth 48 of pit 30 can be greater than 70% of the width 46 of the opening of the pit. For example the depth 48 can be made to be 100%, 200%, or more than 200% of the width 46 of the opening of the pit 30.

Figure 7:
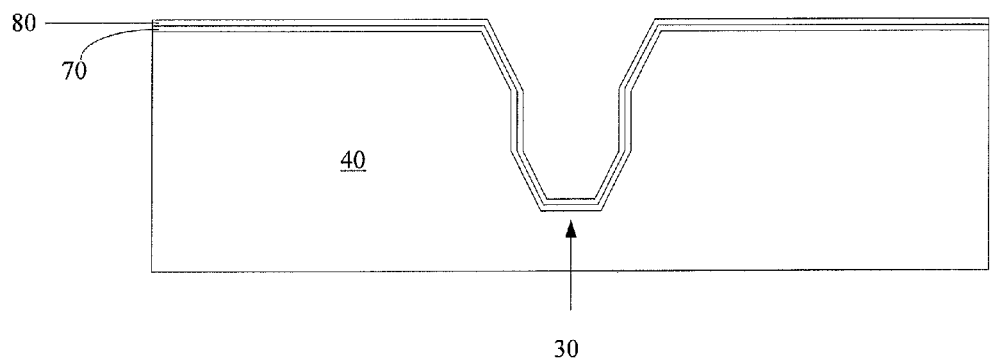

A release layer 70 can then be provided on substrate 40 and in pits 30 as shown in FIG. 7. The release layer 70 can aid the subsequent process of separating the probe tips that are formed in the pits 30 from the substrate 40 (as described in more detail below). Accordingly, any material serving this function can be used in the release layer. In some embodiments, the release layer can be any material that is readily removed (e.g., etched), separating the probe tip (not shown in FIG. 7) to be formed in pit 30 from substrate 40. Non-limiting examples of suitable materials for the release layer 70 include aluminum (which can be dissolved with sodium hydroxide), copper, gold, titanium, tungsten, silver, and combinations or alloys thereof. The release layer 70 can be deposited in any suitable manner, such as by chemical vapor deposition (CVD) or sputtering. In other embodiments, the release layer 70 can comprise more than one layer.

As also shown in FIG. 7, a seed layer 80 can then be provided on the release layer 70. As will be discussed below, the seed layer 80 can be connected to the anode or cathode of a electrodeposition system, and material forming probe tips (not shown in FIG. 7) can thus be electroplated onto seed layer 80. Accordingly, any electrically conductive material can be used as the seed layer 80. Non-limiting examples of suitable conductive materials for the seed layer 80 include copper, palladium, titanium, tungsten, silver, and combinations or alloys thereof. The seed layer may be deposited in any suitable manner, such as by CVD or sputtering. In other embodiments, the release layer can comprise more than one layer. In some embodiments, the release layer 70 and the seed layer 80 can be the same layer. That is, one layer that is both readily removed to separate the probe tip (not shown in FIG. 7) from substrate 40 and electrically conductive can function as both a release layer and a seed layer. For example, copper can function as both a release layer and a seed layer.

Figure 8:
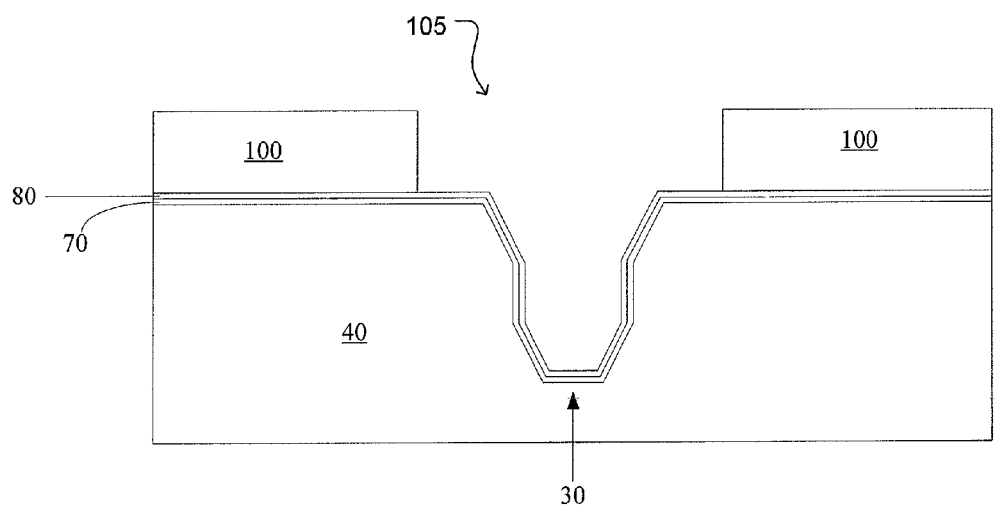

Then, as shown in FIG. 8, a third mask layer 100 can be provided. The third mask layer 100 can comprise either a single layer or multiple layers. In some embodiments, the third mask layer 100 can comprise, for example, any suitable photoresist material. The third mask layer 100 can contain a pattern of openings 105 that expose the pits 30 with the seed and release layer(s) therein. To form the openings 105, the third mask layer 100 can be patterned using a photolithographic process as known in the art. The width of the openings 105 can be selected to be larger than the to-be-formed probe tips. Accordingly, the width can range from about 25 to about 75 microns. In some embodiments, the width of the openings 105 can be about 44 microns. The foregoing numerical examples are exemplary only and, in some embodiments, different numerical dimensions can be implemented.

With openings 105 formed, tips can be formed in pits 30 and openings 105. FIGS. 9 and 10 illustrate one exemplary way to form tips 110', and FIG. 11 illustrates an alternative exemplary way to form tips 110" according to some embodiments of the invention.

Referring first to the process of making tips 110' illustrated in FIGS. 9 and 10, a tip material 115 can be deposited to fill the pit 30 and to over fill the opening 105 in mask layer 100 as shown in FIG. 9. The tip material 115 can comprise any suitable tip material and can comprise multiple layers of material deposited into pit 30. For example, tip material 115 can be electrically conductive. Non-limiting examples of suitable conductive materials for tip material 115 include palladium, gold, rhodium, nickel, cobalt, silver, platinum, conductive nitrides, conductive carbides, tungsten, titanium, molybdenum, rhenium, indium, osmium, copper, refractory metals, and their combinations and alloys. The tip material 115 can be deposited by any suitable deposition process, including electroplating, CVD, physical vapor deposition, sputtering, electro-less plating, electron beam deposition, and thermal evaporation. In some embodiments, the tip material 115 can be deposited by electroplating so that the tip material 115 deposits only on the surfaces of the seed layer 80 exposed through the openings 105 in the mask layer 100. In addition, in some embodiments, tip material 115 can comprise multiple materials deposited into pit 30. As shown in FIG. 10, the third mask layer 100 and tip material 115 can be planarized to create a generally flat surface area 150 of tip material 115. The planarization process can be performed by any known process, whether a mechanical grinding process or chemical-mechanical polishing process. Tips 110' can thus be formed in pits 30 and openings 105 in accordance with the process illustrated in FIGS. 9 and 10.

As mentioned above, FIG. 11 illustrates an alternative (to the process illustrated in FIGS. 9 and 10) way of making tips 110" in pits 30 and opening 105 in the third mask layer 100. As shown in FIG. 11, tip material 115 can be deposited to fill the pit 30 and to under fill the opening 105 as shown in FIG. 11. The tip material 115 can comprise any of the materials discussed above and can be deposited in any of the ways discussed above. Tips 110" can thus be formed in pits 30 and openings 105 in accordance with the process illustrated in FIG. 11.

Regardless of whether the tips 110'/110" are made in accordance with the process shown in FIGS. 9 and 10 or the process shown in FIG. 11, once the tips 110'/110" are formed, the third mask layer 100 can be removed by any suitable process known in the art. The photoresist material of the third mask layer 100 can be removed using a conventional stripping solution such as a sulfuric acid and peroxide mixture (also known as a piranha mixture). Following removal of the third mask layer 100, the resulting structure can be processed with an oxygen plasma to remove any residual unwanted materials. Further cleaning, if necessary, can be performed as known in the art.

Figure 12:
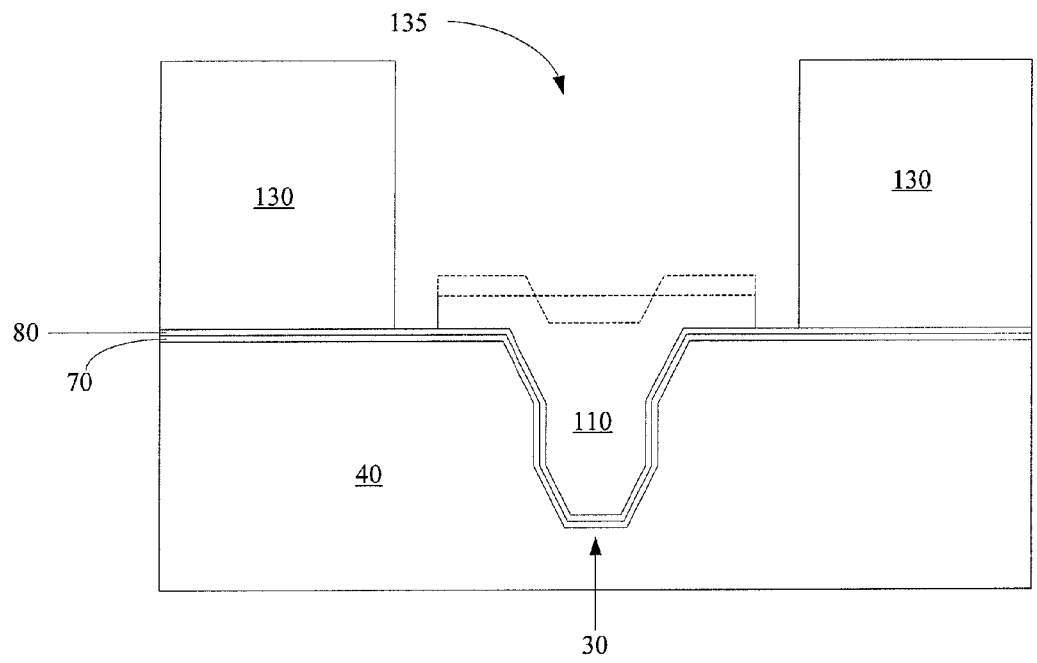

As shown in FIG. 12 (tip 110 in FIG. 10 represents either tip 110' formed in accordance with the process of FIGS. 9 and 10 or tip 110" formed in accordance with the process of FIG. 11), a fourth mask layer 130 can be provided and comprise either a single layer or multiple layers. In some embodiments, the fourth mask layer 130 can be deposited on substrate 40. The fourth mask layer 130 can comprise, for example, any suitable photoresist material. The fourth mask layer 130 can contain a pattern of openings 135 (one is shown but more can be provided) that expose the tip 110. To form the openings 135, the fourth mask layer 130 can be patterned during a photolithographic process as known in the art. The width of the openings 135 can be selected to be larger than the tip 110 and, in some embodiments, substantially the same as the width of the beam of the cantilever structure that will be attached to the tip 110. Accordingly, the width can range from about 40 to about 100 microns. In some embodiments, the width of the openings 135 can be about 50 microns. The foregoing numerical examples are exemplary only and, in some embodiments, different numerical dimensions can be implemented.

Although not shown in FIG. 12, an adhesion layer can optionally be deposited on the tip 110. This adhesion layer (not shown) can be used to aid the adhesion of the tip 110 to a base (as described below). Thus, the adhesion layer (not shown) can comprise any suitable material that promotes adhesion of the tip 110 to the base to be created. Non-limiting examples of suitable materials for the adhesion layer (not shown) include titanium, tungsten, molybdenum, chrome, copper, and their combinations and alloys. The adhesion layer (not shown) can be formed by a deposition process, including electroplating, CVD, physical vapor deposition, sputtering, electro-less plating, electron beam deposition, and thermal evaporation.

Figure 13:
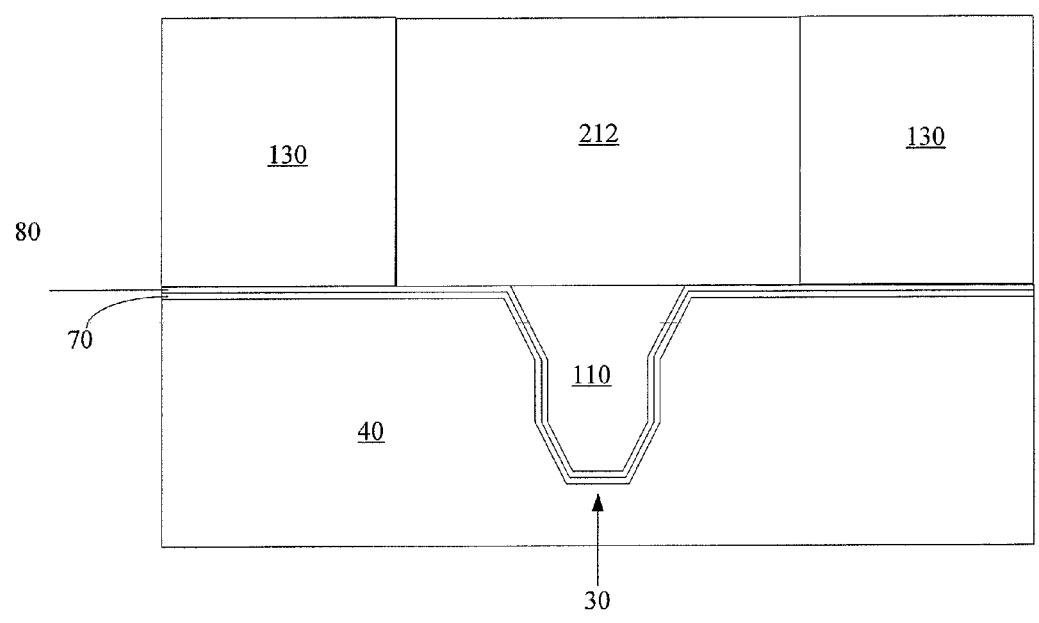

As shown in FIG. 13, material can be deposited into openings 135 to form a base 212. The material deposited into openings 135 to form base 212 can be the same as or different than the tip 110. Moreover, base 212 can comprise multiple layers of materials deposited into openings 135. Non-limiting examples of suitable materials for forming base 212 include palladium, gold, rhodium, nickel, cobalt, silver, platinum, conductive nitrides, conductive carbides, tungsten, titanium, molybdenum, rhenium, indium, osmium, copper, refractory metals, and their combinations and alloys. The material for base 212 can be deposited into openings 135 by any suitable deposition process, including electroplating, CVD, physical vapor deposition, sputtering, electro-less plating, electron beam deposition, and thermal evaporation.

Figure 14:
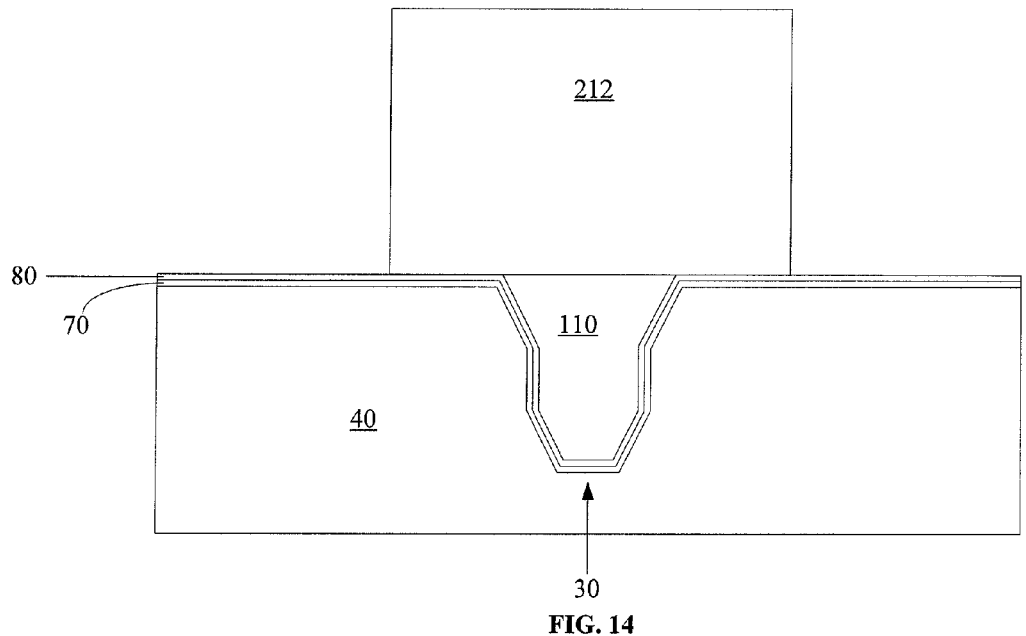

As shown in FIG. 14, the fourth mask layer 130 can be removed by any suitable process known in the art. The photoresist material of the fourth mask layer 130 can be removed using a conventional stripping solution such as a sulfuric acid and peroxide mixture (also known as a piranha mixture). Following removal of the fourth mask layer 130, the resulting structure can be processed with an oxygen plasma to remove any residual unwanted materials. Further cleaning, if necessary, can be performed as known in the art As shown in FIG. 14, the result can be structures (one is shown but many can be made) comprising a probe tip 110 and a base 212 disposed on substrate 40.

As shown in FIGS. 15-19, the base 212 can be attached to a beam 210, forming a probe structure 200 (again, although one base 212 and one beam 210 are shown, many can be implemented). As shown, the base 212 can be attached to the beam 210 such that the beam is cantilevered. The base 212 can be attached to the beam 210 using any known attachment process, including brazing, welding, soldering, or a combination thereof. Alternatively, beam 210 can be formed in a fifth mask layer (not shown) deposited on top of the fourth mask layer 130 and base 212 (see FIG. 13) after the material forming base 212 is deposited in opening 135 but before fourth mask layer 130 is removed from substrate 40. The material deposited to form beam 210 can be the same as or different than the material deposited in opening 135 to form base 212, and the material forming beam 210 can be deposited in the same manner as the material that forms base 212. The beam 210 can be formed of multiple materials.

Figure 15:
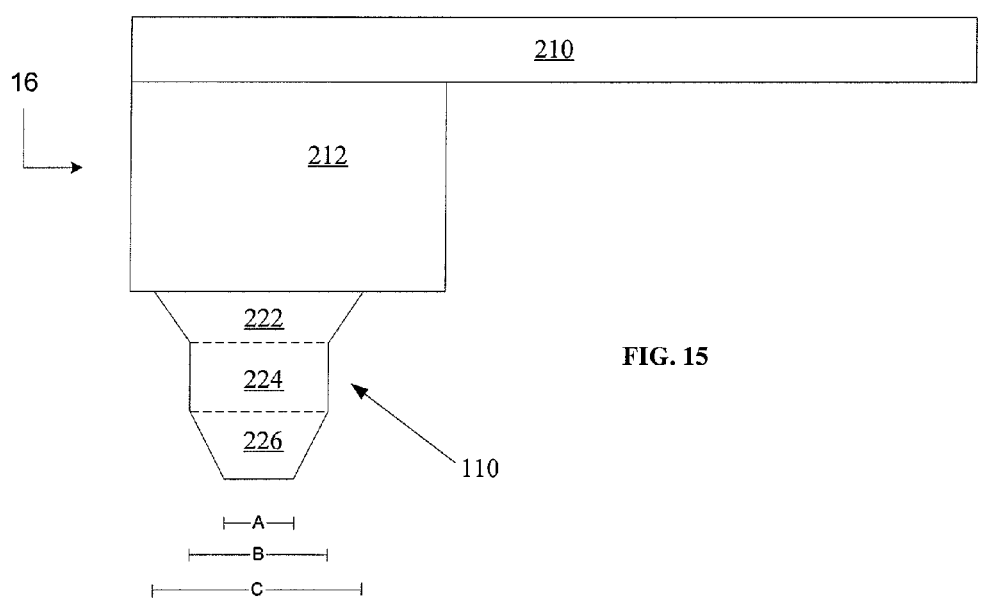
FIG. 15 illustrates a side view of a probe comprising a probe tip attached to a cantilever structure comprising a base and a beam.
Figure 16:
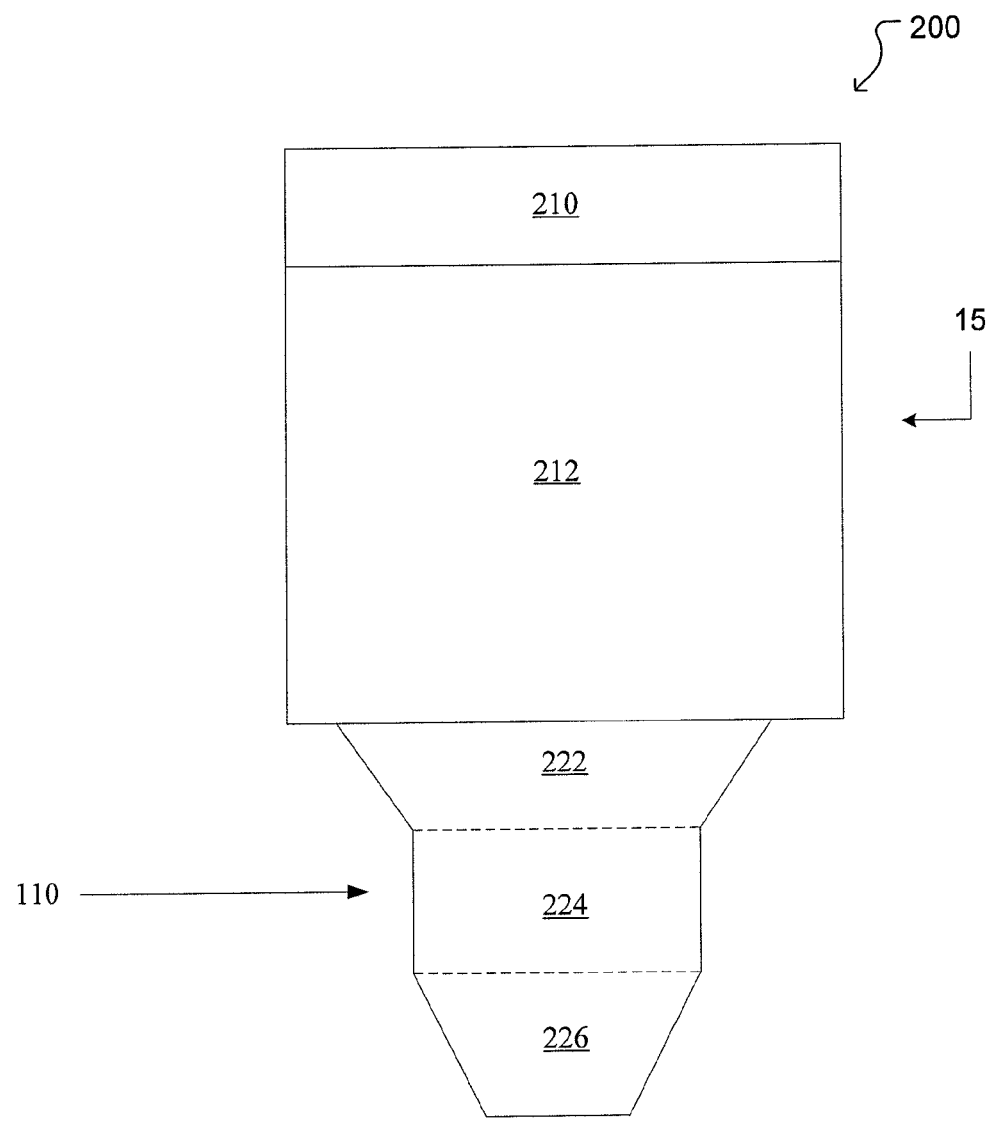
FIG. 16 illustrates a front view of the probe of FIG. 15.

Next, the substrate 40 can be removed, leaving the tip 110 attached to the base 212 and the base 212 attached to the beam 210 as depicted in FIGS. 15-19. The substrate 40 can be removed by etching release layer 70 (see FIG. 7). The result can be a probe 200 comprising a probe tip 110, a base 212, and a beam 210 as shown in FIGS. 14-19. Moreover, the probe tip 110 can include a contact portion 226. The contact portion 226 can have a substantially trapezoidal shape. FIG. 15 illustrates a non-limiting example in which the contact portion 226 can have a generally truncated pyramid shape with a shorter width A at one end and a longer width B where the contact portion 226 meets the extension portion 224. Alternatively, the contact portion 226 can have other shapes, such as pyramid shapes or blades shapes, such as exemplary blade shapes disclosed in U.S. Pat. No. 6,441,315 (see, e.g., FIGS. 2B, 6A, 6B, 8A, and 10 of U.S. Pat. No. 6,441,315). For example, the shape of pit 30 in FIG. 2 of this application can be elongate into the page to form a generally blade shaped contact portion 226. Moreover, the blade shape can be made to be generally sharpened by etching at FIG. 5 to form a generally sharp point (from the view show in FIG. 5) at the bottom of the pit 30. As shown, the probe tip 110 can also include a pedestal portion 222. The pedestal portion 222 can have a substantially trapezoidal shape. FIG. 15 illustrates a non-limiting example in which the pedestal portion 222 can have a generally truncated pyramid shape with a shorter width B where the pedestal portion 222 meets the extension portion 224 and a longer width C where the pedestal portion 222 meets the base 212. The probe tip can also include an extension portion 224 that is located between the contact portion 226 and the pedestal portion 222. In some embodiments, the width C can affect the minimum achievable pitch of an array of probes with probe tips like probe tip 110. That is, the width C can affect the minimum achievable distance between adjacent probes in an array of probes with tips like probe tip 110. The width B of the extension portion 224 can be substantially the same along the length of the extension portion (see FIG. 15). In some embodiments, the width B can be selected to be an acceptable width of a contact surface of the probe tip 110 so that the tip 110 can continue to be used even after the contact portion 226 has worn away. Pedestal portion 222 can also alternatively have shapes other than trapezoidal, and extension portion 224 can have shapes other than rectangular.

Figure 17:
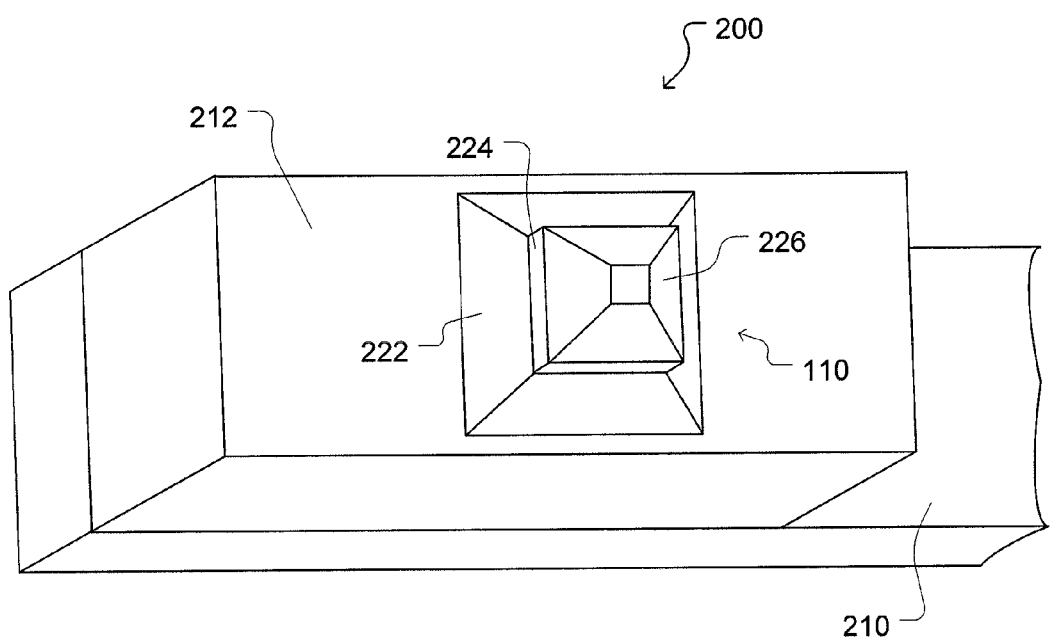
FIGS. 17-19 illustrate various views and orientations of the probe of FIGS. 15 and 16.
Figure 18:
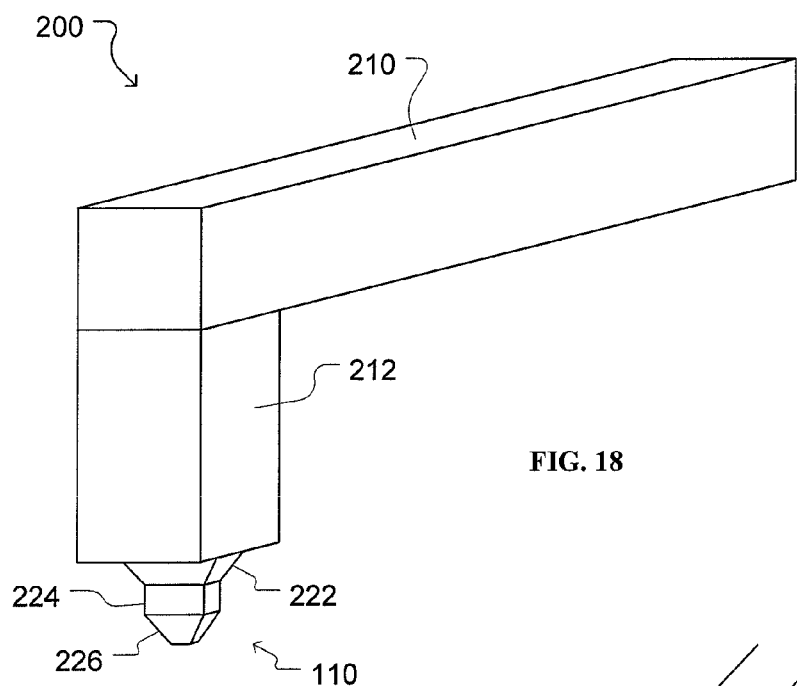
Figure 19:
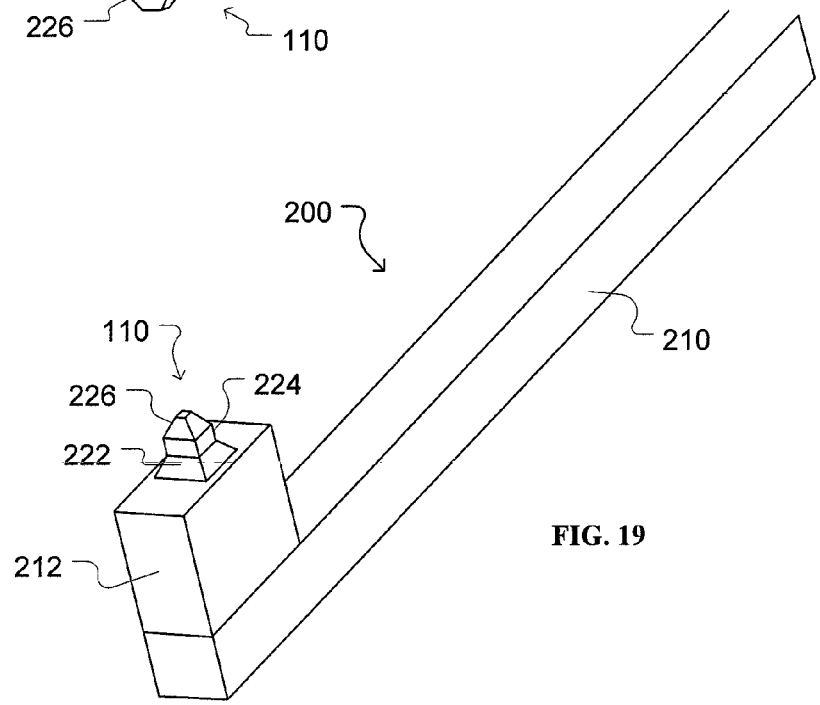

As best seem in FIGS. 17-19, which show various views and exemplary orientations of probe 200, the probe tip 110 and base 212 can be attached to the beam 210 to form a probe 200 according to some embodiments of the invention. As shown, the probe tip 110 can extend away from the base 212. But for the presence of the extension portion 224, the contact portion 226 and the pedestal portion 222 could form a trapezoidal shaped structure. With the presence of the extension portion 224, both the pedestal portion and contact portion can have a substantial trapezoidal shaped structure. In some embodiments, the pedestal portion 222 and contact portion 226 can have a truncated pyramid shape as discussed above.

Figure 20:
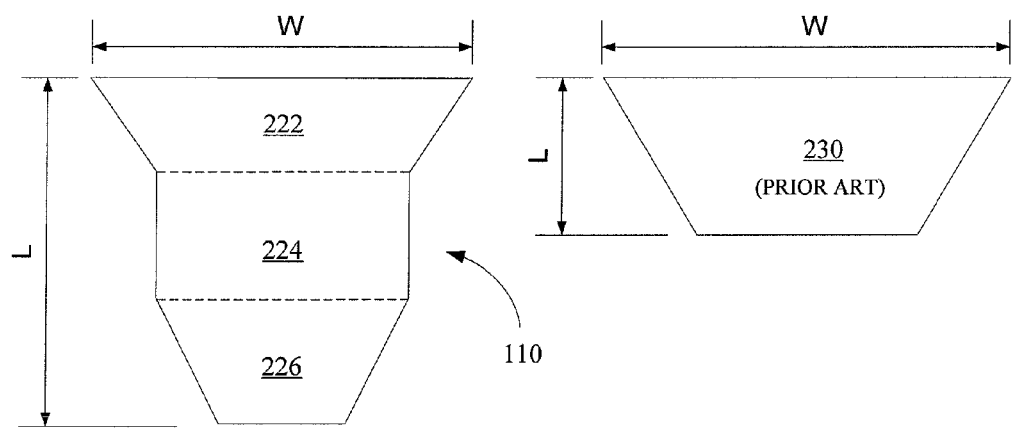
FIG. 20 compares the structure of a convention probe tip with an exemplary structure formed using the methods depicted in the FIGS. 2-14 above according to some embodiments of the invention.

As depicted in FIG. 20, the probe tip 110 can have a structure that is different form conventional probe tips 230. Conventional lithographically-formed probe tips 230 can have a trapezoidal shape, but it has not been possible to form such probe tips 230 with a trapezoidal shape that has a length L that is greater than 70% of its width W. That is, due to limitations in etching technology (e.g., crystallographic silicon etching), the aspect ratio (i.e., the length L divided by the width W as shown in FIG. 20) in conventional lithographically formed probe tips 230 does not appear to exceed 0.7. In contrast, the aspect ratio (i.e., the length L divided by the width W as shown in FIG. 20) of tip 110 formed using the process illustrated in FIGS. 2-14 can be made to exceed 0.7 and, indeed, can be made to exceed 1 and, in some configurations, to exceed even 2. Thus, the length L of the tip 110 can be greater than 70% of the width W (as shown in FIG. 20). For example, the length L can be 100%, 200%, or more of the width W.

Figure 21:
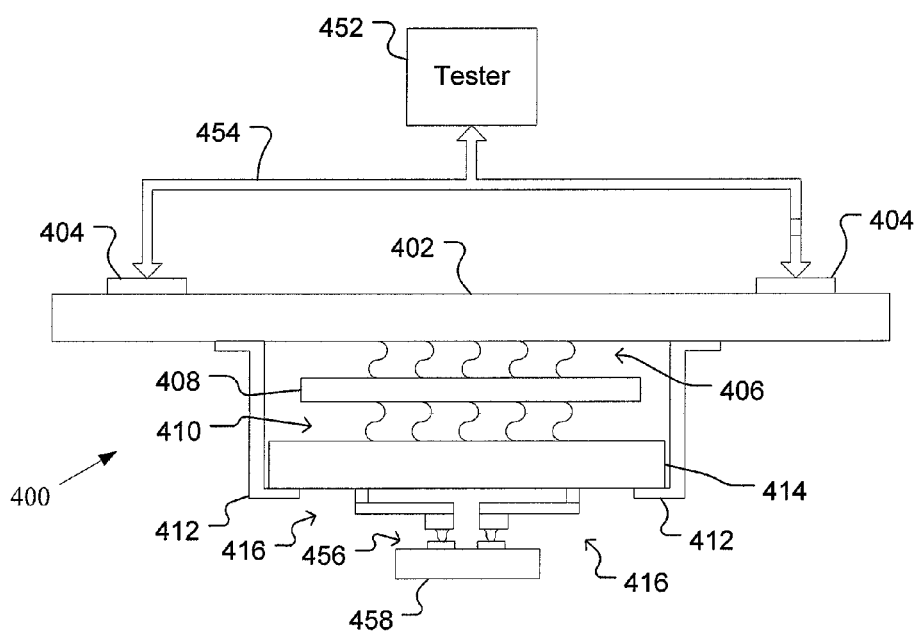
FIG. 21 depicts an exemplary test system including an exemplary probe card assembly with probes like the probes of FIGS. 15-19, according to some embodiments of the invention.

FIG. 21 illustrates an exemplary use of probes, like probes 200. FIG. 21 illustrates an exemplary test system including an exemplary probe card assembly 400 according to some embodiments of the invention. As shown, the probe card assembly 400 can include probes 416, each of which can be like probe 200. Probes 416 can be configured to contact input and/or output terminals 456 on an electronic device under test ("DUT") 458. The probe card assembly 400 can then be used to test the DUT 458. The DUT can be dies of an unsingulated semiconductor wafer, dies singulated from a wafer (packaged or unpackaged), dies of an array of singulated semiconductor dies disposed in a carrier or other holding device, or one or more multi-die electronics modules. Moreover, DUT 458 can be other types of electronic device to be tested, such as wiring boards, printed circuit boards, or any other type of electronic device or devices.

The probe card assembly 400 of FIG. 21 can include three substrates: a wiring board 402, an interposer 408, and a probe head 414. Terminals 404 can electrically connect the probe card assembly 400 to a plurality of communications channels 454 to a tester 452, which can be configured to generate test data to be input into DUT 458 and evaluate response data produced by DUT 458 in response to the test data. Such test data generated by the tester 452 can be received at terminals 404, which can be pads for receiving pogo pins, zero-insertion-force connectors, or any other connection device suitable for such a connection. Data paths for the test data can be provided through the probe card assembly 400 by electrical connections (not shown) through wiring board 402 to electrically conductive spring interconnections 406, the spring interconnections 406, electrical connections (not shown) through interposer 408 to electrically conductive spring interconnections 410, the spring interconnections 410, and electrical connections (not shown) through probe head 414 to probes 416 (which can be in contact with input and/or output terminals 456 of DUT 458). Response data generated by DUT 458 can be returned to the tester 452 through probes 416 and the above described electrical paths through the probe card assembly 400 to terminals 404 and from terminals 404 through communications channels 454 to the tester 452. The tester 452 can evaluate the response data (e.g., compare the response data to expected response data) to determine whether the DUT 458 (or individual devices of the DUT 458 if the DUT 458 comprises a plurality of electronic devices, such as semiconductor dies) pass or fail the testing. In addition or alternatively, the tester 452 can rate the DUT 458.

The probe head 414 and interposer 408 may be secured to the wiring board 402 using any suitable means (not shown), including without limitation bolts, screws, clamps, brackets, spring devices, etc. U.S. Pat. Nos. 5,974,662 and 6,509,751 describe exemplary probe card apparatuses. In addition, U.S. patent application Ser. No. 11/165,833, filed Jun. 24, 2005, and entitled Method And Apparatus For Adjusting A Multi-Substrate Probe Structure, discloses probe card assemblies in which a large array of probes is created from smaller probe arrays disposed on multiple probe heads, and each probe head can be independently adjustable. Various features of the probe card apparatuses described in any of the forgoing patents or patent application can be implemented in the probe card assembly 400.

Figure 1B:
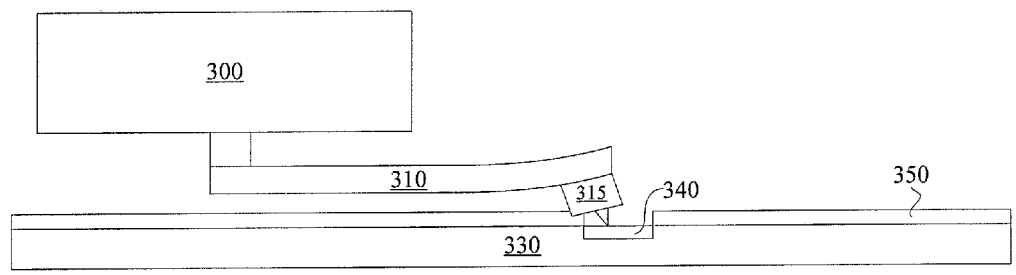

As mentioned above, the additional length of probe tip 110 made possible by extension portion 224, in some embodiments, provides the advantage of avoiding the heel strike problem shown in FIG. 1B. In some embodiments, other advantages can also be provided. For example, the additional length of probe tip 110 provided by extension portion 224 can aide in contacting terminals of a semiconductor die that are located below the upper surface of a coating, such as a passivation layer, on the die. As is known, in some cases, a die is coated with a protective layer, such as a passivation layer, and the input/output terminals of the die are located below the outer surface of the protective layer and are accessible through openings in the protective layer. In some embodiments, tips 110 can better contact such terminals than prior art tips (e.g., 230 of FIG. 20).

Having described these aspects of the invention, it is understood that the invention defined by the appended claims is not to be limited by particular details set forth in the above description, as many apparent variations thereof are possible without departing from the spirit or scope thereof.

I claim:

1. A probe tip comprising:
   an extension portion having a substantially rectangular cross-sectional shape;
   a pedestal portion integral with a first surface of the extension portion and having a substantially trapezoidal cross-sectional shape; and
   a contact portion integral with a second surface of the extension portion, the contact portion comprising a substantially trapezoid cross-sectional shape,
   wherein an aspect ratio of the probe tip is greater than 0.7.

2. The probe tip of claim 1, wherein the substantially trapezoidal cross-sectional shape of the pedestal portion is a substantially truncated pyramid shape, and the substantially trapezoidal cross-sectional shape of the contact portion is a substantially truncated pyramid shape.

3. The probe tip of claim 1, wherein the aspect ratio of the probe tip is greater than 1.

4. The probe tip of claim 1, wherein the aspect ratio of the probe tip is greater than 2.

5. The probe tip of claim 1, wherein the pedestal portion comprises an attachment surface opposite the first surface of the extension portion and disposed to be connected to a probe structure.

6. The probe tip of claim 5, wherein the aspect ratio comprises a ratio of a sum of lengths of the extension portion, the pedestal portion, and the contact portion to a width of the attachment surface of the pedestal.

7. The probe tip of claim 5 wherein a width of the attachment surface is greater than a width of the first surface of the extension portion, and a width of a contact surface of the contact portion configured to contact an electronic device is smaller than the second surface of the extension portion.

8. The probe tip of claim 7, wherein the width of the first surface of the extension portion and the width of the second surface of the extension portion are approximately equal.

9. The probe tip of claim 5, wherein the attachment surface of the pedestal portion is connected to a base structure, and the base structure is connected to a cantilevered beam.

10. The probe tip of claim 9, wherein the pedestal portion, the extension portion, and the contact portion are sized to contact a bond pad of a semiconductor die.

11. A probe tip as in claim 1, further comprising a cantilever beam to which the probe tip is attached, wherein the probe tip and the beam are formed of different materials.

12. A probe tip as in claim 11, wherein the probe tip is attached to the beam by any one of a brazed joint, welded joint, a soldered joint, or combinations thereof.

13. A probe tip as in claim 1, wherein the extension portion, the pedestal portion, and the contact portion are integral and composed of the same material.

14. A probe card assembly comprising:
   a support structure;
   an electrical interface with a tester, the electrical interface disposed on the support structure;
   a plurality of probes disposed on the support structure and configured to contact terminals of an electronic device to be tested, wherein the probes are electrically connected to the electrical interface and each probe comprises the probe tip of any one of claims 1 or 2-8.

15. The probe card assembly of claim 14, wherein each of the probes further comprises:
   a cantilever beam, and
   a base attached to the cantilever beam and to which one of the contact tips is attached.

* * * * *